United States Patent
Hopper et al.

(10) Patent No.: US 7,250,841 B1
(45) Date of Patent: Jul. 31, 2007

(54) SAUCER-SHAPED HALF-LOOP MEMS INDUCTOR WITH VERY LOW RESISTANCE

(75) Inventors: Peter J. Hopper, San Jose, CA (US); Peter Johnson, Sunnyvale, CA (US); Kyuwoon Hwang, Palo Alto, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 111 days.

(21) Appl. No.: 11/213,155

(22) Filed: Aug. 25, 2005

(51) Int. Cl.
*H01F 27/02* (2006.01)

(52) U.S. Cl. .................. 336/82; 336/200; 336/174

(58) Field of Classification Search ............... 336/200, 336/223, 232, 82, 173–175
See application file for complete search history.

(56) References Cited

U.S. PATENT DOCUMENTS

| | | | |
|---|---|---|---|
| 3,638,156 A * | 1/1972 | West ........................ | 336/200 |
| 3,881,244 A * | 5/1975 | Kendall .................... | 29/602.1 |
| 6,008,102 A * | 12/1999 | Alford et al. ............... | 438/381 |
| 6,148,500 A * | 11/2000 | Krone et al. ............... | 29/602.1 |
| 6,292,084 B1 * | 9/2001 | Choi et al. .................. | 336/200 |
| 6,573,818 B1 | 6/2003 | Klemmer et al. ............ | 336/83 |
| 6,990,729 B2 * | 1/2006 | Pleskach et al. ............. | 29/606 |
| 2005/0005424 A1 * | 1/2005 | Nuytkens et al. ........... | 29/602.1 |

OTHER PUBLICATIONS

Jin Woo Park, Florent Cros and Mark G. Allen, "A Sacrificial Layer Approach To Highly Laminated Magnetic Cores," in Proc. 15th IEEE Int. Confer. MEMS, Jan. 2002, pp. 380-383.
Jin-Woo Park and Mark G. Allen, "Ultralow-Profile Micromachined Power Inductors With Highly Laminated Ni/Fe Cores:Application To Low-Megahertz DC-DC Converters", IEEE Transactions On Magnetics, vol. 39, No. 5, Sep. 2003, pp. 3184-3186.
U.S. Appl. No. 11/200,384, filed Aug. 9, 2005, Johnson et al.
David P. Arnold, Florent Cros, Iulica Zana, David R. Veazie and Mark G. Allen, "Electroplated Metal Microstructures Embedded In Fusion-Bonded Silicon:Conductors And Magnetic Materials", Journal of Micromechanical Systems, vol. 13, No. 5, Oct. 2004, pp. 791-796.
David P. Arnold, Iulica Zana, Florent Cros and Mark G. Allen, "Vertically Laminated Magnetic Cores By Electroplating Ni-Fe Into Micromachined Si", IEEE Transactions On Magnetics, vol. 40, No. 40, Jul. 2004, pp. 3060-3062.

* cited by examiner

*Primary Examiner*—Anh Mai
(74) *Attorney, Agent, or Firm*—Mark C. Pickering

(57) ABSTRACT

A micro-electromechanical system (MEMS) inductor is formed in a saucer shape that completely surrounds a magnetic core structure which is formed from a ferromagnetic material. In addition, an array of MEMS inductors can be formed by dividing up the saucer-shaped MEMS inductor into a number of electrically-isolated MEMS inductor wedges.

13 Claims, 5 Drawing Sheets

SAUCER-SHAPED HALF-LOOP MEMS INDUCTOR WITH VERY LOW RESISTANCE

BACKGROUND OF THE INVENTION

1. Field of the Invention

The present invention relates to MEMS inductors and, more particularly, to a saucer-shaped half-loop MEMS inductor with very low resistance.

2. Description of the Related Art

A micro-electromechanical system (MEMS) inductor is a semiconductor structure that is fabricated using the same types of steps (e.g., the deposition of layers of material and the selective removal of the layers of material) that are used to fabricate conventional analog and digital CMOS circuits.

MEMS inductors are commonly formed as coil structures. When greater inductance is required, the coil structure is typically formed around a magnetic core structure. Core structures formed from laminated Ni—Fe have been shown to have low eddy current losses, high magnetic permeability, and high saturation flux density.

Although prior-art MEMS inductors provide a solution to many applications, and thereby provide an easy process for providing an on-chip inductor, the prior-art MEMS inductors have an excessively high resistance for other applications, such as applications which require inductor resistance in the milliohm range. Thus, there is a need for a MEMS inductor that provides very low resistance.

BRIEF DESCRIPTION OF THE DRAWINGS

FIG. 1A is a plan view, FIG. 1B is a cross-sectional view taken along line 1B—1B of FIG. 1A, and FIG. 1C is a cross-sectional view also taken along line 1B—1B of FIG. 1A.

FIG. 3A is a plan view, FIG. 3B is a cross-sectional view taken along line 3B—3B of FIG. 3A, FIG. 3C is a bottom view, and FIG. 3D is a cross-sectional view taken along line 3D—3D of FIG. 3A.

DETAILED DESCRIPTION OF THE INVENTION

Figure 1A:
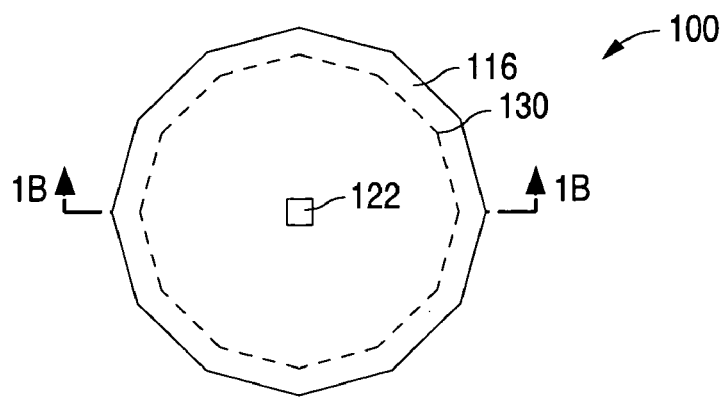
FIGS. 1A–1C are views illustrating an example of a MEMS inductor 100 in accordance with the present invention.
Figure 1B:
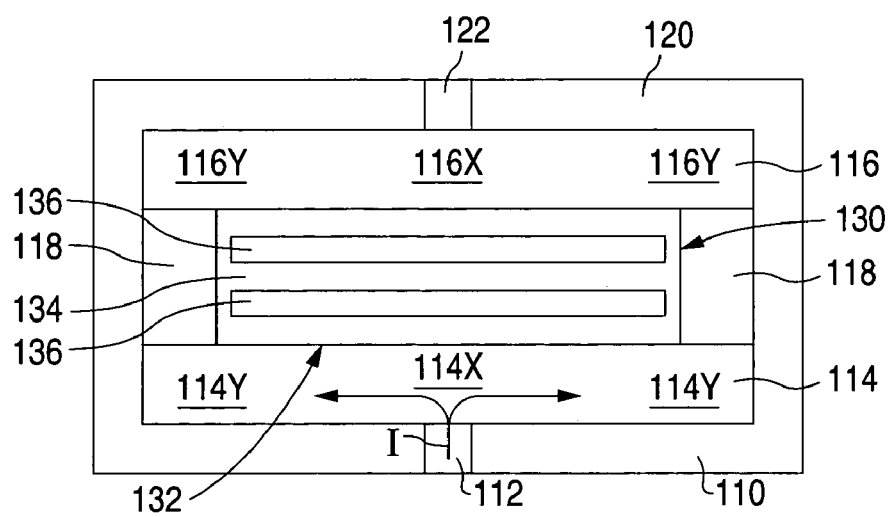
Figure 1C:
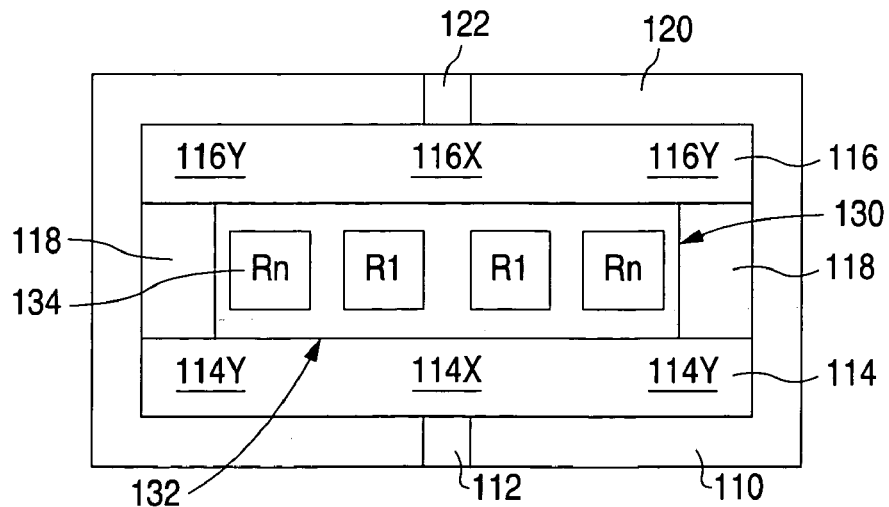

FIGS. 1A–1C show views that illustrate an example of a MEMS inductor 100 in accordance with the present invention. FIG. 1A shows a plan view, FIG. 1B shows a cross-sectional view taken along line 1B—1B of FIG. 1A, and FIG. 1C shows a cross-sectional view also taken along line 1B—1B of FIG. 1A. As described in greater detail below, by utilizing a single thick layer of metal in a saucer shape, a high-inductance (nH) half-loop inductor can be formed that provides very low resistance.

As shown in FIGS. 1A–1C, MEMS inductor 100 includes a layer of isolation material 110, and a via 112 that is formed through isolation material 110. In addition, inductor 100 includes a bottom conductive plate 114 that contacts isolation material 110 and via 112, and a top conductive plate 116 that lies over bottom conductive plate 114.

Bottom conductive plate 114 has a thickness, an inner region 114X that contacts via 112, and an outer region 114Y spaced-apart from via 112 that surrounds the periphery of inner region 114X. Similarly, top conductive plate 116 has a thickness, an inner region 116X, and a spaced-apart outer region 116Y that surrounds the periphery of inner region 116X. The bottom and top conductive plates 112 and 114 can optionally have center openings.

In the present example, the bottom and top conductive plates 114 and 116, which can have substantially the same thicknesses, are illustrated as 12-sided plates. Alternately, the bottom and top conductive plates 114 and 116 can also be formed to have a greater or lesser number of sides, with at least five sides.

Further, MEMS inductor 100 includes a conductive sidewall 118 that has a bottom surface and a top surface. The bottom surface is in contact with outer region 114Y of bottom conductive plate 114, and spaced apart from inner region 114X. The top surface, in turn, is in contact with outer region 116Y of top conductive plate 116, and spaced apart from inner region 116X. Sidewall 118 can have the same shape as the bottom and top conductive plates 114 and 116 which, in the present example, is 12-sided.

As additionally shown in FIGS. 1A–1C, MEMS inductor 100 includes an isolation region 120 that contacts top conductive plate 116, and a via 122 that is formed through isolation region 120. Via 122, which is spaced apart from outer region 116Y, makes an electrical connection with inner region 116X of top conductive plate 116. Further, via 122 can be located directly over the via 112.

In addition, bottom conductive plate 114, top conductive plate 116, and conductive sidewall 118, which can be formed from materials including copper, define a 12-sided enclosed region 130 that lies only between bottom conductive plate 114, top conductive plate 116, and sidewall 118. A more circular-shaped enclosed region can be defined, for example, by utilizing plates 114 and 116 with 16 sides.

As further shown in FIGS. 1A–1C, MEMS inductor 100 includes a magnetic core structure 132 that is located between plates 114 and 116 within enclosed region 130, and within no other enclosed regions. As a result, magnetic core structure 132 is completely encircled by conductive sidewall 118.

In addition, magnetic core structure 132, which is electrically isolated from all other conductive regions by an insulation region 134, can be implemented in a number of prior-art fashions using a ferromagnetic material. For example, as shown in FIG. 1B, for low frequency applications, magnetic core structure 132 can be implemented with a number of laminated Ni—Fe cores 136. The thickness of the laminations must be thin enough to minimize eddy currents. In addition, each of the one or more laminated Ni—Fe cores 136 has a shape which fits inside enclosed region 130, such as a circular or 12-sided shape.

Alternately, as shown in FIG. 1C, for high frequency applications, magnetic core structure 132 can be implemented with a number of concentric rings R1–Rn of a ferromagnetic material. In high frequency applications, magnetic flux flowing through the ferromagnetic material experiences an effect similar to the skin effect such that the flux flows substantially only at the surface. Concentric rings R1–Rn provide additional surface area which, in turn, increases the magnetic flux that can flow.

In operation, a current I can flow into MEMS inductor 100 at the center of bottom conductive plate 114, and out radially in all directions to sidewall 118. Current I then flows up sidewall 118, radially inward to the center of top conductive plate 116, and out at the center of top conductive plate 116 to via 122. Current I can also flow in the opposite direction.

A current flowing through an inductor generates a magnetic field which has magnetic flux. Magnetic flux can be thought of as lines of force. The number of lines of force in a given area, the magnetic flux density, depends on the permeability of the material that the magnetic flux flows through. For example, air and a ferromagnetic material, such as Ni—Fe, have significantly different permeabilities.

Figure 2:
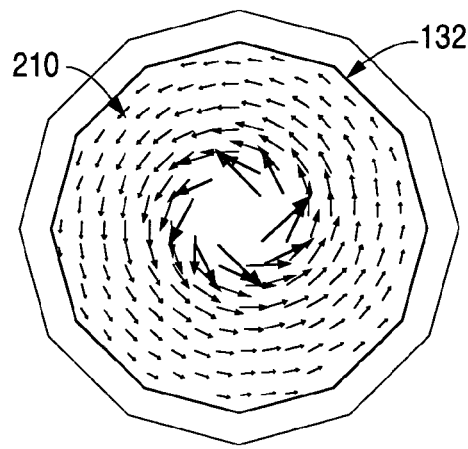
FIG. 2 is a plan view illustrating the magnetic flux in core structure 132 in accordance with the present invention.

FIG. 2 shows a plan view that illustrates the magnetic flux in core structure 132 in accordance with the present invention. As shown in FIG. 2, magnetic core structure 132 has a number of magnetic flux lines 210 that move around magnetic core structure 132 in a circular fashion. Thus, a large number of magnetic flux lines 210 can form endless loops entirely within magnetic core structure 132.

As a result, the inductor of the present invention can generate a maximum magnetic flux density (B field) at a lower magnetic field (H field). Since the strength of the magnetic field H is related to the magnitude of the current flowing through the inductor, the present invention can generate the maximum magnetic flux density B with a lower inductor current.

Thus, an example of a saucer-shaped half-loop MEMS inductor has been described in accordance with the present invention. One of the advantages of the inductor of the present invention is that the inductor provides very, very low resistance due to the thicknesses of the metal layers, satisfying resistance requirements of a few milliohm. In addition, the inductor of the present invention can be formed to be quite large, e.g., having a footprint nearly the same size as the die, to enclose a large magnetic core structure to generate nano-Henry inductance levels.

Figure 3A:
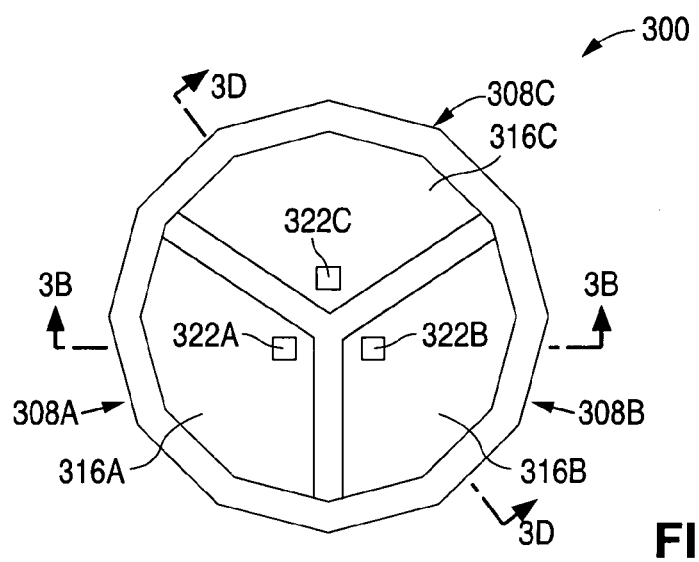
FIGS. 3A–3D are views illustrating an example of a MEMS inductor array 300 in accordance with the present invention.
Figure 3B:
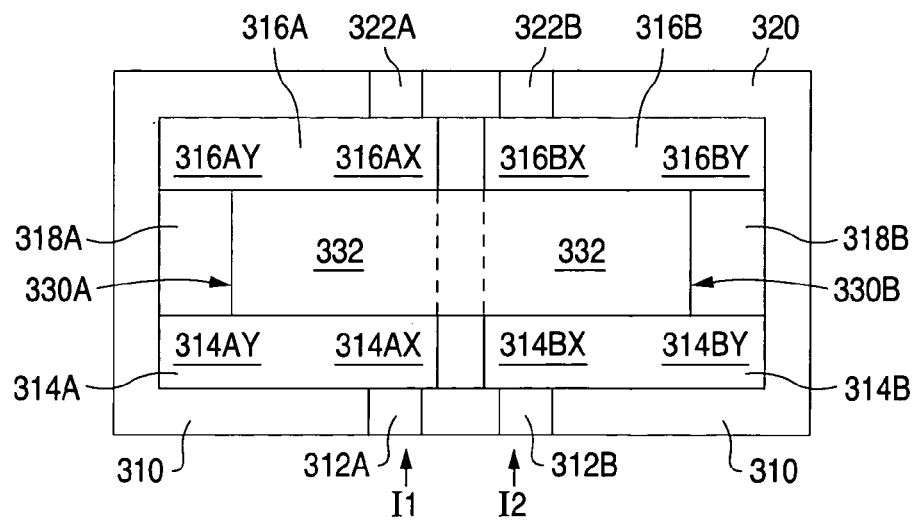
Figure 3C:
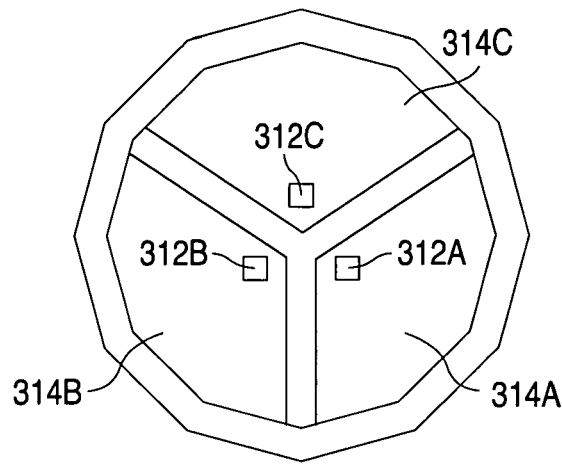
Figure 3D:
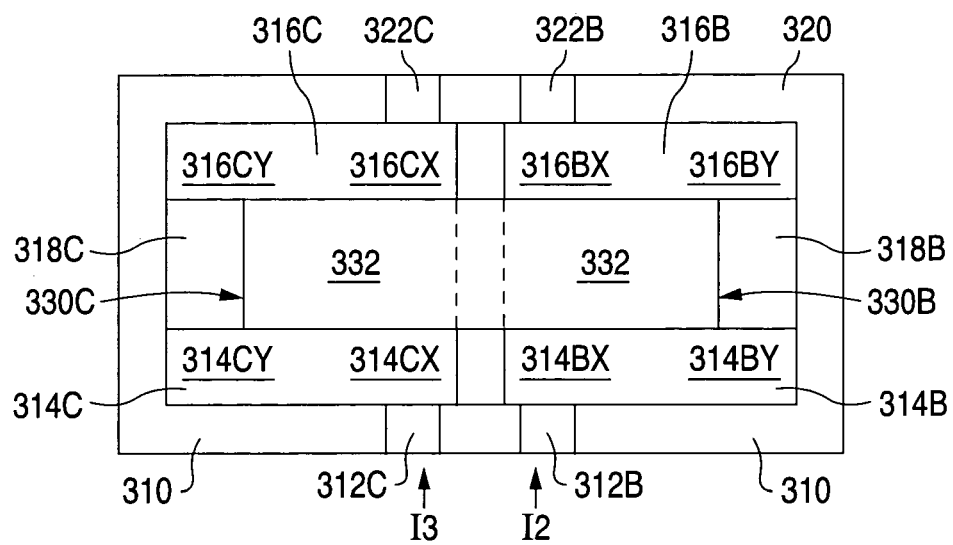

FIGS. 3A–3D show views that illustrate an example of a MEMS inductor array 300 in accordance with the present invention. FIG. 3A shows a plan view, FIG. 3B shows a cross-sectional view taken along line 3B—3B of FIG. 3A, FIG. 3C shows a bottom view, and FIG. 3D shows a cross-sectional view taken along line 3D—3D of FIG. 3A.

As shown in FIGS. 3A–3D example, array 300 includes three MEMS inductors 308A, 308B, and 308C. The three MEMS inductors 308A, 308B, and 308C, in turn, include a layer of isolation material 310, and three vias 312A, 312B, and 312C that are formed through isolation material 310.

Further, inductors 308A, 308B, and 308C have three bottom conductive plates 314A, 314B, and 314C lying in a common plane that contact isolation material 310 and vias 312A, 312B, and 312C, respectively, and three top conductive plates 316A, 316B, and 316C lying in a common plane that lie over the bottom conductive plates 314A, 314B, and 314C, respectively.

The bottom conductive plates 314A, 314B, and 314C have equal thicknesses, inner regions 314AX, 314BX, and 314CX that contact vias 312A, 312B, and 312C, respectively, and outer regions 314AY, 314BY, and 314CY spaced-apart from vias 312A, 312B, and 312C. Similarly, the top conductive plates 316A, 316B, and 316C have equal thicknesses, inner regions 316AX, 316BX, and 316CX, and spaced-apart outer regions 316AY, 316BY, and 316CY.

Further, MEMS inductors 308A, 308B, and 308C include three conductive sidewalls 318A, 318B, and 318C that have bottom surfaces and top surfaces. The bottom surfaces are connected to outer regions 314AY, 314BY, and 314CY of bottom conductive plates 314A, 314B, and 314C, respectively, and spaced apart from inner regions 314AX, 314BX, and 314CX, respectively.

The top surfaces are connected to outer regions 316AY, 316BY, and 316CY of top conductive plates 316A, 316B, and 316C, respectively, and spaced apart from inner regions 316AX, 316BX, and 316CX, respectively. Sidewalls 318A, 318B, and 318C can have the same shape as the outer edges of the bottom and top conductive plates 314A, 314B, and 314C and 316A, 316B, and 316C, respectively.

As additionally shown in FIGS. 3A–3D, inductors 308A, 308B, and 308C include an isolation region 320 that contacts top conductive plates 316A, 316B, and 316C, and vias 322A, 322B, and 322C that are formed through isolation region 320. Vias 322A, 322B, and 322C, in turn, make electrical contacts with inner regions 316AX, 316BX, and 316CX of top conductive plates 316A, 316B, and 316C. Vias 322A, 322B, and 322C are also spaced apart from outer regions 316AY, 316BY, and 316CY.

In addition, the bottom conductive plates 314A, 314B, and 314C, the top conductive plates 316A, 316B, and 316C, and the conductive sidewalls 318A, 318B, and 318C, which can be formed from materials including copper, define three enclosed regions 330A, 330B, and 330C, respectively, that lie only between the bottom conductive plates 314A, 314B, and 314C, and the top conductive plates 316A, 316B, and 316C.

As further shown in FIGS. 3A–3D, array 300 includes a magnetic core structure 332 that is located between plates 314A, 314B, and 314C and 316A, 316B, and 316C within enclosed regions 330A, 330B, and 330C, and within no other enclosed regions. In addition, magnetic core structure 332, which is electrically isolated from all other conductive regions by an insulation region, can be implemented in a number of prior-art fashions using a ferromagnetic material. For example, magnetic core structure 332 can be implemented with core structure 132.

In the FIGS. 3A–3D example, array 300 is illustrated with three MEMS inductors 308A, 308B, and 308C. Array 300 can alternately be formed to have a greater or lesser number of MEMS inductors by forming array 300 to have a greater or lesser number of pie shaped wedges.

In operation, currents I1, I2, and I3 can flow into MEMS inductors 308A, 308B, and 308C through vias 312A, 312B, and 312C, respectively, and out radially to sidewalls 318A, 318B, and 318C. The currents I1, I2, and I3 then flow up sidewalls 318A, 318B, and 318C, and radially inward to vias 322A, 322B, and 322C, respectively. The currents I1, I2, and I3 can also flow in the opposite direction.

An array of inductors can be used in a number of applications. For example, an array of inductors can be utilized with a staged DC-to-DC switching regulator, such as a buck regulator. The use of multiple stages reduces the ripple produced by the switching regulator which, in turn, allows a smaller smoothing capacitor to be used.

Figure 4A:
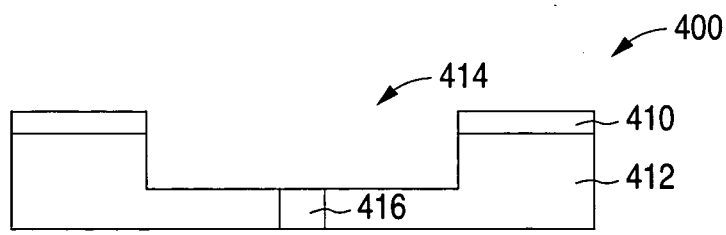
FIGS. 4A–4H are a series of cross-sectional views illustrating an example of a method 400 of forming a MEMS inductor in accordance with the present invention.

FIGS. 4A–4H show a series of cross-sectional views that illustrate an example of a method 400 of forming a MEMS inductor in accordance with the present invention. As shown in FIG. 4A, a mask 410 is formed on a dielectric layer 412, and etched to form an opening 414 which, in the present example, has 12 sides. In addition, at the center of opening 414, a via 416 is exposed. Dielectric layer 412 and via 416 are conventionally formed. Mask 410 is then removed.

Figure 4B:
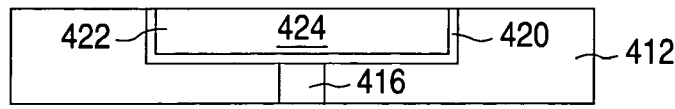

Next, as shown in FIG. 4B, a barrier layer 420 is formed on dielectric layer 412, followed by the formation of a copper seed layer 422 and electroplating. The resulting layer is then planarized until removed from the top surface of dielectric layer 412, thereby forming a bottom conductive plate 424. Barrier layer 420 prevents copper seed layer 422, such as chromium, copper, chromium (Cr—Cu—Cr), from diffusing into dielectric material 412 and can be implemented with, for example, tantalum Ta or tantalum nitride TaN. The planarization can be performed using, for example, conventional chemical mechanical polishing.

Figure 4C:
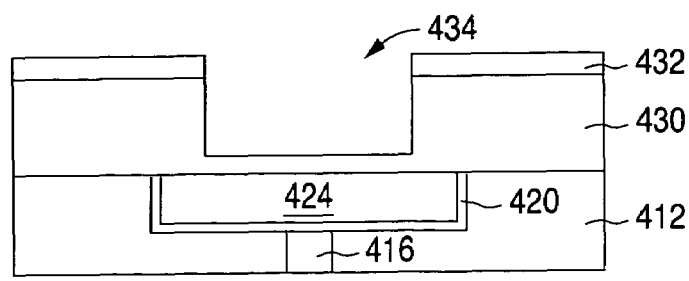

Following this, as shown in FIG. 4C, an isolation layer 430, such as photosensitive epoxy, is formed on dielectric layer 412 and bottom conductive plate 424. After this, a mask 432 is formed on isolation layer 430. Isolation layer 430 is then etched to form a core opening 434. Mask 432 is then removed.

Figure 4D:
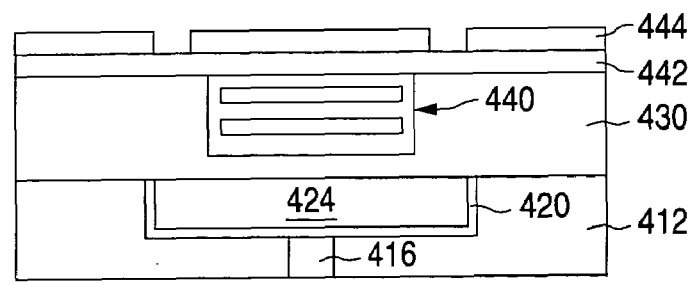

Next, as shown in FIG. 4D, a magnetic core structure 440 is located in core opening 434 using prior-art methods. For example, Park et al., "Ultralow-Profile Micromachined Power Inductors with Highly Laminated Ni/Fe Cores: Application to Low-Megahertz DC-DC Converters," IEEE Transactions of Magnetics, Vol. 39, No. 5, September 2003, pp 3184–3186, teach the formation of a MEMS magnetic core structure that uses laminated Ni—Fe structures.

As taught by Park et al., to form a magnetic core structure, a mold is filled with sequential electrodeposition of Ni—Fe (80%–20%) and Cu layers. In accordance with the present invention, the mold can have the same shape as the bottom conductive plate 424. After a number of layers have been formed, the mold is removed, and the structure is stabilized.

For example, a center opening can be formed through the sequential layers, followed by the deposition of a layer of metal that lines the opening. The layer of metal is then masked and etched, forming a structure that stabilizes the sequential layers by lining the opening. After this, the Cu is etched away from between the NiFe layers.

Another stabilizing material can then be deposited to provide support between adjacent NiFe layers to form magnetic core structure 440. If concentric rings are to be formed, a mask can be formed on magnetic core structure 440, and the exposed regions etched. (The etch that forms the rings can alternately be performed at the same time the center opening is formed.)

Figure 4E:
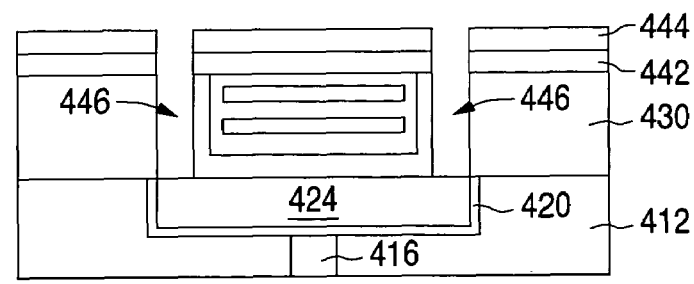

Following the formation of magnetic core structure 440, a layer of isolation material 442, such as photosensitive epoxy, is formed over magnetic core structure 440, and then planarized. After this, a mask 444 is formed on isolation layer 442 to define the sidewalls. As shown in FIG. 4E, after mask 444 has been formed, isolation layer 442 and then isolation layer 430 are etched to form an opening 446 that exposes the periphery of bottom conductive plate 424. Mask 444 is then removed.

Figure 4F:
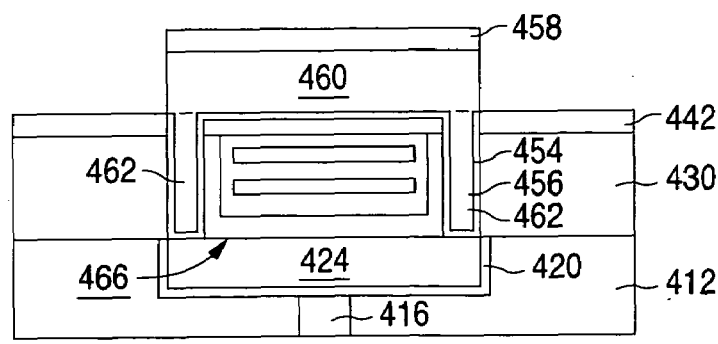

Next, as shown in FIG. 4F, a barrier layer 454 is formed on isolation layer 442 and in opening 446, followed by the formation of a copper seed layer 456 and electroplating. After this, a mask 458 is formed and patterned. The exposed material is then etched to form a top conductive plate 460, and a conductive sidewall 462. Conductive sidewall 462 has a bottom surface that contacts the top surface of bottom conductive plate 424, and a top surface that contacts the bottom surface of top conductive plate 460.

Bottom conductive plate 424 and top conductive plate 460 define an enclosed region 466 that lies only between the bottom and top conductive plates 424 and 460. In addition, enclosed region 466 can further be defined by conductive sidewall 462, such that enclosed region 466 lies only between the bottom and top conductive plates 424 and 460 and conductive sidewall 462.

Figure 4G:
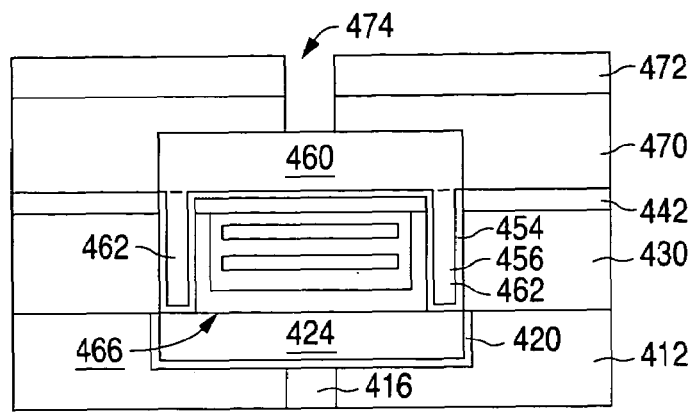

As shown in FIG. 4G, once the exposed material has been removed, mask 458 is removed, and a layer of insulation material 470 is formed on top conductive plate 460. After this, a mask 472 is formed and patterned. The exposed region is then etched to form a via opening 474. Mask 472 is then removed.

Figure 4H:
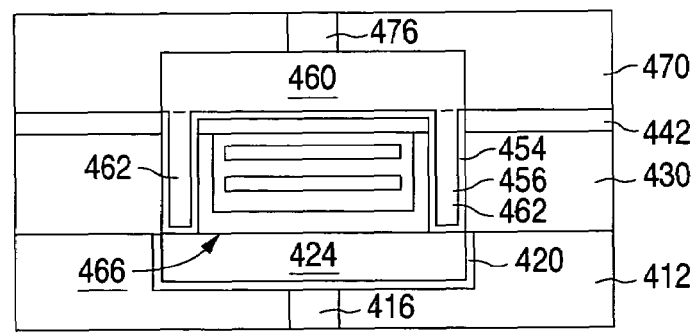

After this, as shown in FIG. 4H, a layer of via material is formed on insulation material 470 to fill up opening 474. The layer of via material is then planarized to remove the layer of via material from the top surface of the layer of insulation material 470 to form a via 476. The method then continues with conventional processing steps.

Thus, the formation of a half loop MEMS inductor has been described. The MEMS inductor can have inductances in the nH range, and very low resistance due to its thickness. For example, the thickness of bottom conductive plate and top conductive plate 424 and 460 can each be 20–50 μm thick. (Metal-1 typically has a thickness of 0.5 μm.)

An inductor array, such as array 300, can be formed in a similar fashion. For example, when an inductor array is formed, opening 414 exposes a number of vias. In addition, after bottom conductive plate 424 has been formed, a masking and etching step can be used to form a number of bottom conductive plates, such as plates 314A, 314B, and 314C.

Figure 5A:
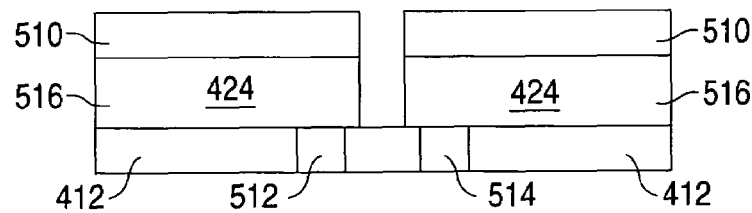
FIGS. 5A–5B are cross-sectional views further illustrating the formation of an inductor array in accordance with the present invention.
Figure 5B:
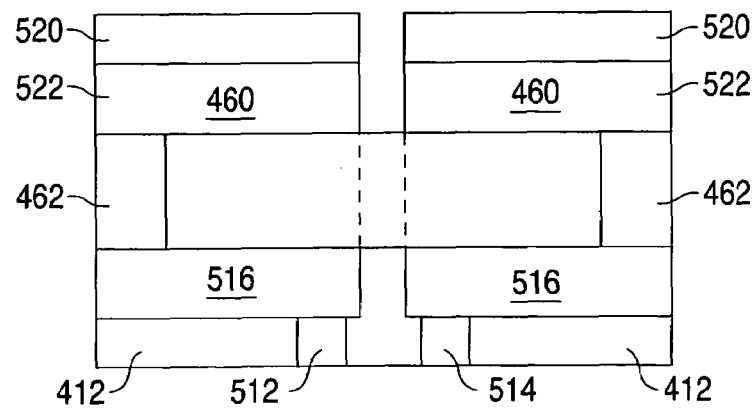

FIGS. 5A–5B show cross-sectional views that further illustrate the formation of an inductor array in accordance with the present invention. As shown in FIG. 5A, a mask 510 is formed and patterned on bottom conductive plate 424 which, in turn, is connected to vias 512 and 514. Once mask 510 has been formed, the exposed regions are etched to form a number of bottom conductive plates 516, such as plates 314A, 314B, and 314C.

Further, when an inductor array is formed, mask 444 is patterned to form a corresponding number of sidewalls. Thus, when isolation layer 442 and then isolation layer 430 are etched, a number of openings are formed rather than single opening 446. In addition, after top conductive plate 460 has been formed, a masking and etching step can be used to form a number of top conductive plates, such as plates 316A, 316B, and 316C.

As shown in FIG. 5B, a mask 520 is formed and patterned on top conductive plate 460. Once mask 520 has been formed, the exposed regions are etched to form a number of top conductive plates 522, such as plates 316A, 316B, and 316C. Further, instead of forming a single via 476 in via opening 474, a number of vias are formed in a number of via openings so that a via contacts each of the number of top conductive plates.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An inductive semiconductor structure comprising:
   a first via;
   a second via;
   a first conductive plate having a first region that contacts the first via, and a second region spaced-apart from the first via;
   a second conductive plate that lies over the first conductive plate, the second conductive plate having a first region that contacts the second via, and a second region spaced-apart from the second via;
   a conductive sidewall that has a bottom surface and a top surface, the bottom surface contacting the second region of the first conductive plate, and being spaced apart from the first region of the first conductive plate, the top surface contacting the second region of the second conductive plate, and being spaced apart from the first region of the second conductive plate; and a magnetic core structure located between the first conductive plate and the second conductive plate, the magnetic core structure being electrically isolated from all other conductive regions.

2. The structure of claim 1 wherein the first regions of the first and second conductive plates are center regions, and the second regions are peripheral regions that surround the center regions.

3. The structure of claim 2 wherein the conductive sidewall completely encircles the magnetic core structure.

4. The structure of claim 3 wherein the second via is located directly over the first via.

5. The structure of claim 3 wherein a current flows between the first and second vias when a potential difference exists between the first and second vias.

6. The structure of claim 5 wherein a plurality of magnetic flux lines follow a circular path around the center region entirely within the magnetic core structure when the current flows.

7. The structure of claim 2 wherein the magnetic core structure includes concentric rings of a ferromagnetic material.

8. The structure of claim 1 and further comprising:
a third via;
a fourth via;
a third conductive plate having a first region that contacts the third via, and a second region spaced-apart from the third via, the first and third conductive plates lying in a common plane, the third conductive plate being electrically isolated from the first conductive plate;
a fourth conductive plate that lies over the third conductive plate, the fourth conductive plate having a first region that contacts the fourth via, and a second region spaced-apart from the fourth via, the second and fourth conductive plates lying a common plane, the fourth conductive plate being electrically isolated from the second conductive plate, the magnetic core structure lying between the third and fourth conductive plates; and a conductive sidewall that has a bottom surface that contacts the second region of the third conductive plate, and a top surface that contacts the second region of the fourth conductive plate.

9. The structure of claim 8 wherein the magnetic core structure includes concentric rings of a ferromagnetic material.

10. The structure of claim 8 wherein a plurality of magnetic flux lines follow a circular path entirely within the magnetic core structure when a current flows between the first and second vias.

11. The structure of claim 8 and further comprising:
a fifth via;
a sixth via;
a fifth conductive plate having a first region that contacts the fifth via, and a second region spaced-apart from the fifth via, the first, third, and fifth conductive plates lying in the first common plane, the fifth conductive plate being electrically isolated from the first and third conductive plates;
a sixth conductive plate that lies over the fifth conductive plate, the sixth conductive plate having a first region that contacts the sixth via, and a second region spaced-apart from the sixth via, the second, fourth, and sixth conductive plates lying the second common plane, the sixth conductive plate being electrically isolated from the second and fourth conductive plates, the magnetic core structure being located between the fifth conductive plate and the sixth conductive plate; and a conductive sidewall that has a bottom surface that contacts the second region of the fifth conductive plate, and a top surface that contacts the second region of the sixth conductive plate.

12. The structure of claim 11 wherein the magnetic core structure includes concentric rings of a ferromagnetic material.

13. The structure of claim 11 wherein a plurality of magnetic flux lines follow a circular path entirely within the magnetic core structure when a current flows between the first and second vias.

* * * * *